United States Patent
Hannigan

[11] Patent Number: 6,147,334
[45] Date of Patent: Nov. 14, 2000

[54] LAMINATED PADDLE HEATER AND BRAZING PROCESS

[75] Inventor: John H. Hannigan, San Carlos, Calif.

[73] Assignee: Marchi Associates, Inc., Redwood City, Calif.

[21] Appl. No.: 09/239,224

[22] Filed: Jan. 29, 1999

Related U.S. Application Data

[62] Division of application No. 09/107,950, Jun. 30, 1998.

[51] Int. Cl.[7] ............................................. H05B 3/44
[52] U.S. Cl. ...................... 219/544; 219/444.1; 118/725
[58] Field of Search ............................ 219/443.1, 444.1, 219/449.1, 451.1, 465.1, 466.1, 467.1, 468.1, 468.2, 540, 544, 552; 118/724, 725, 728; 338/248, 249

[56] References Cited

U.S. PATENT DOCUMENTS

| | | | |
|---|---|---|---|
| 5,034,688 | 7/1991 | Moulene et al. | 219/444.1 |
| 5,314,541 | 5/1994 | Saito et al. | 118/725 |
| 5,397,396 | 3/1995 | Kosky et al. | 118/725 |
| 5,558,717 | 9/1996 | Zhao et al. | 118/725 |
| 5,591,269 | 1/1997 | Arami et al. | 118/725 |
| 5,595,241 | 1/1997 | Jelinek | 118/725 |
| 5,635,093 | 6/1997 | Arena et al. | 118/725 |
| 5,665,166 | 9/1997 | Deguchi et al. | 118/725 |
| 5,904,872 | 5/1999 | Arami et al. | 219/544 |

*Primary Examiner*—Teresa Walberg
*Assistant Examiner*—Fadi H. Dahbour
*Attorney, Agent, or Firm*—Michael Glenn; Donald Hendricks

[57] ABSTRACT

A laminated heater paddle is provided, in which a heater element having a symmetrical pattern is brazed within a heater channel defined between a first layer and a second layer. The laminated heater paddle provides brazed junctions between dissimilar metals. The heater element, having a stainless steel outer surface, is plated with nickel, and is then squeezed between the aluminum lower and upper layers. Aluminum shim stock is used between the first layer of aluminum and the second layer of aluminum or nickel plated stainless steel, wherein the aluminum shim stock provides a brazing medium. The assembly is then subjected to a vacuum, before being heated near the melting point of the aluminum. Alternative heater embodiments include guide tubes or cooling tubes between two or more brazed layers. The brazing process can alternatively be used for other applications.

24 Claims, 14 Drawing Sheets

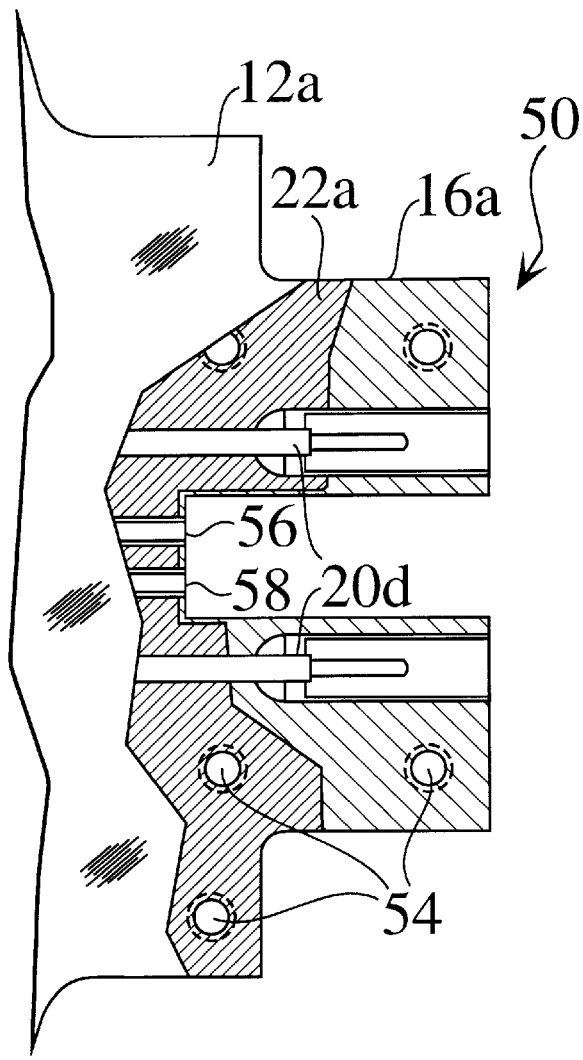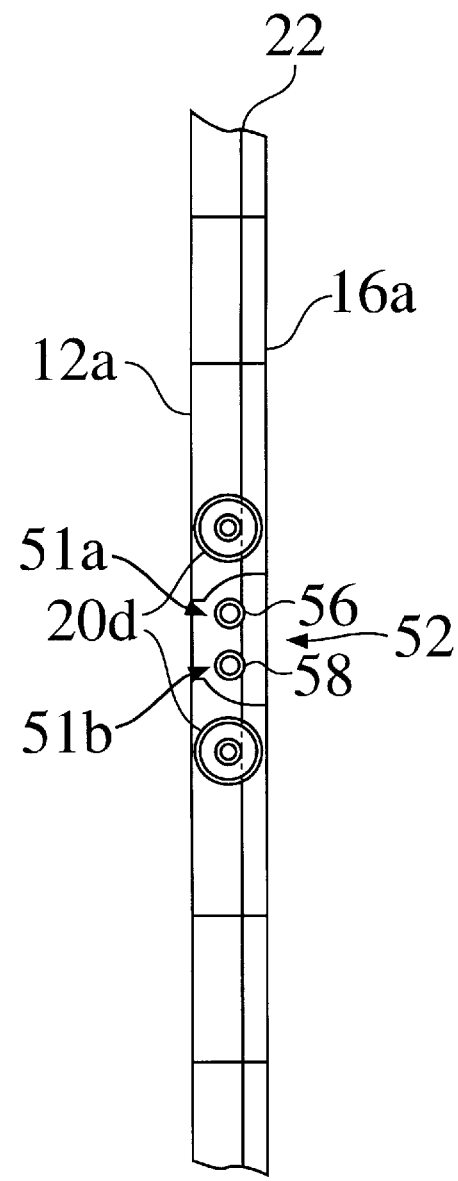
Fig. 10
Fig. 11

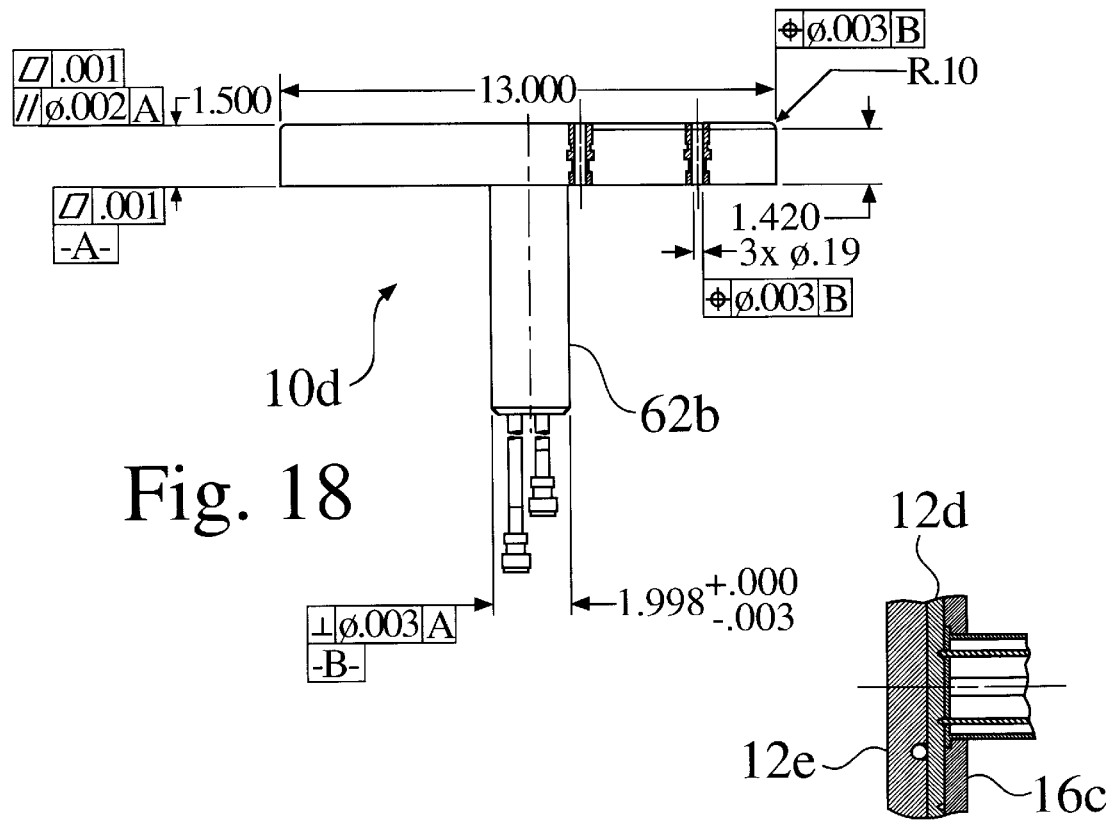
Fig. 18
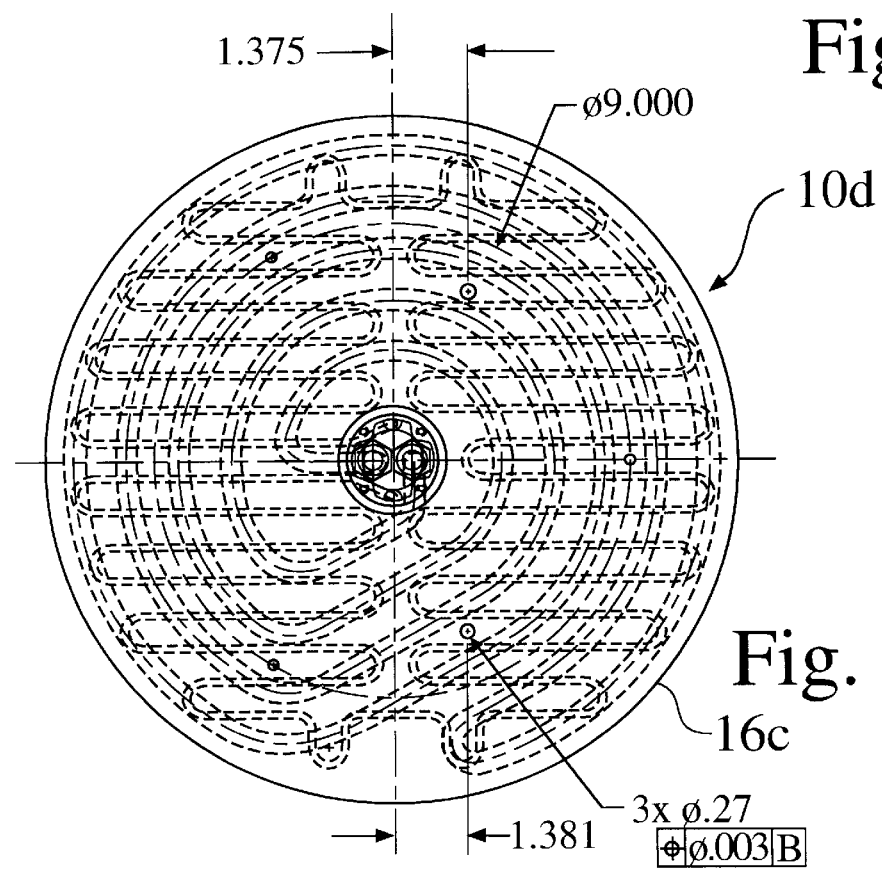
Fig. 20
Fig. 19

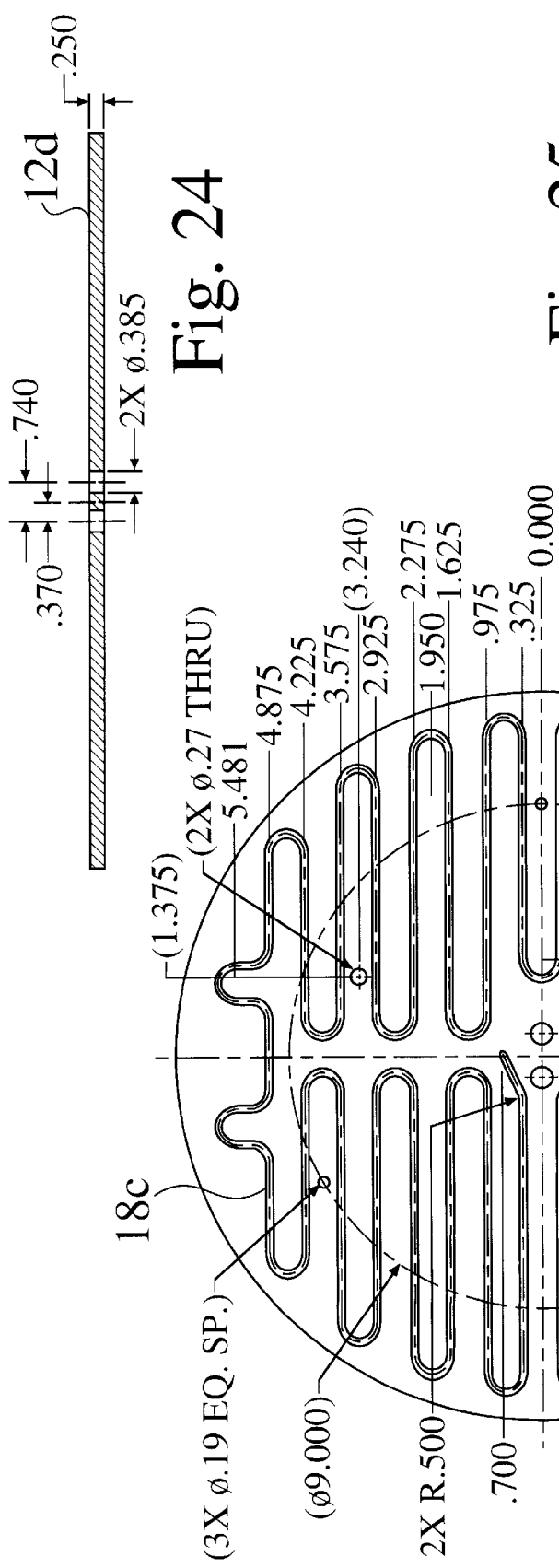
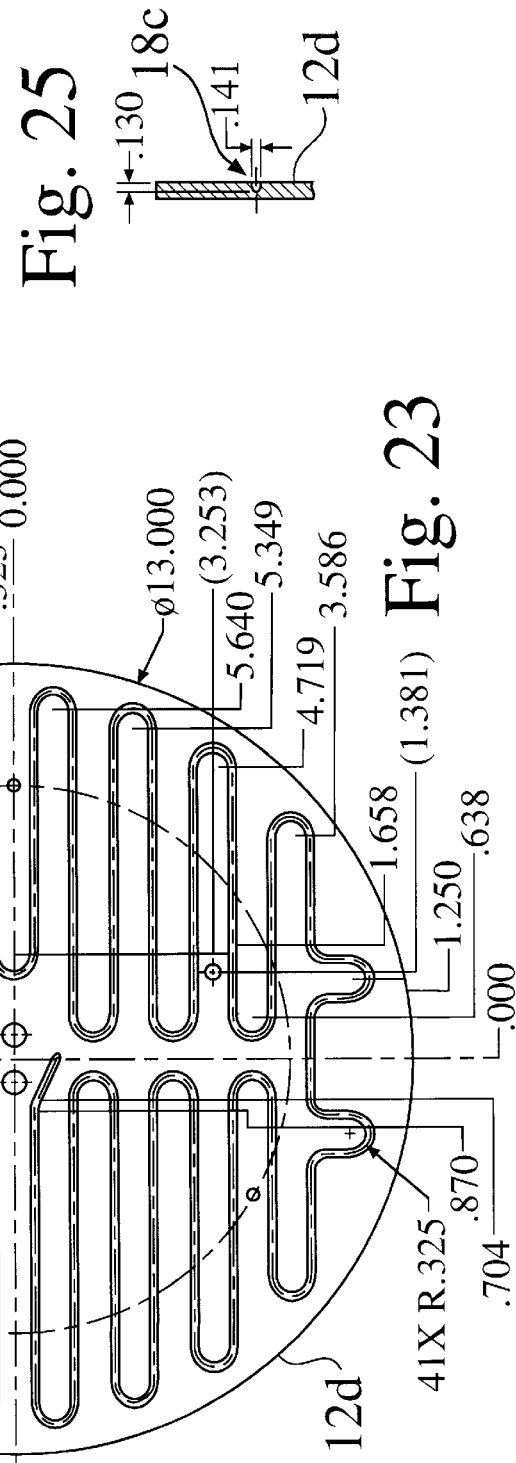
Fig. 24
Fig. 25
Fig. 23

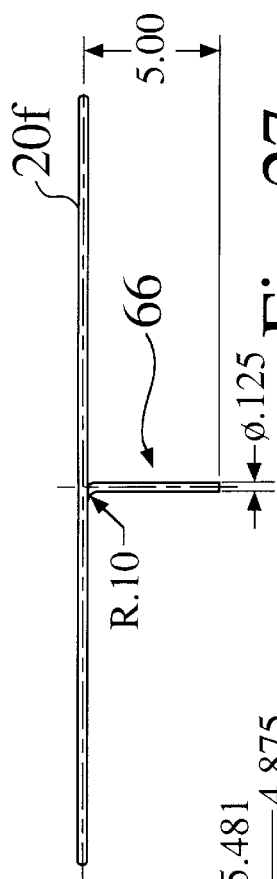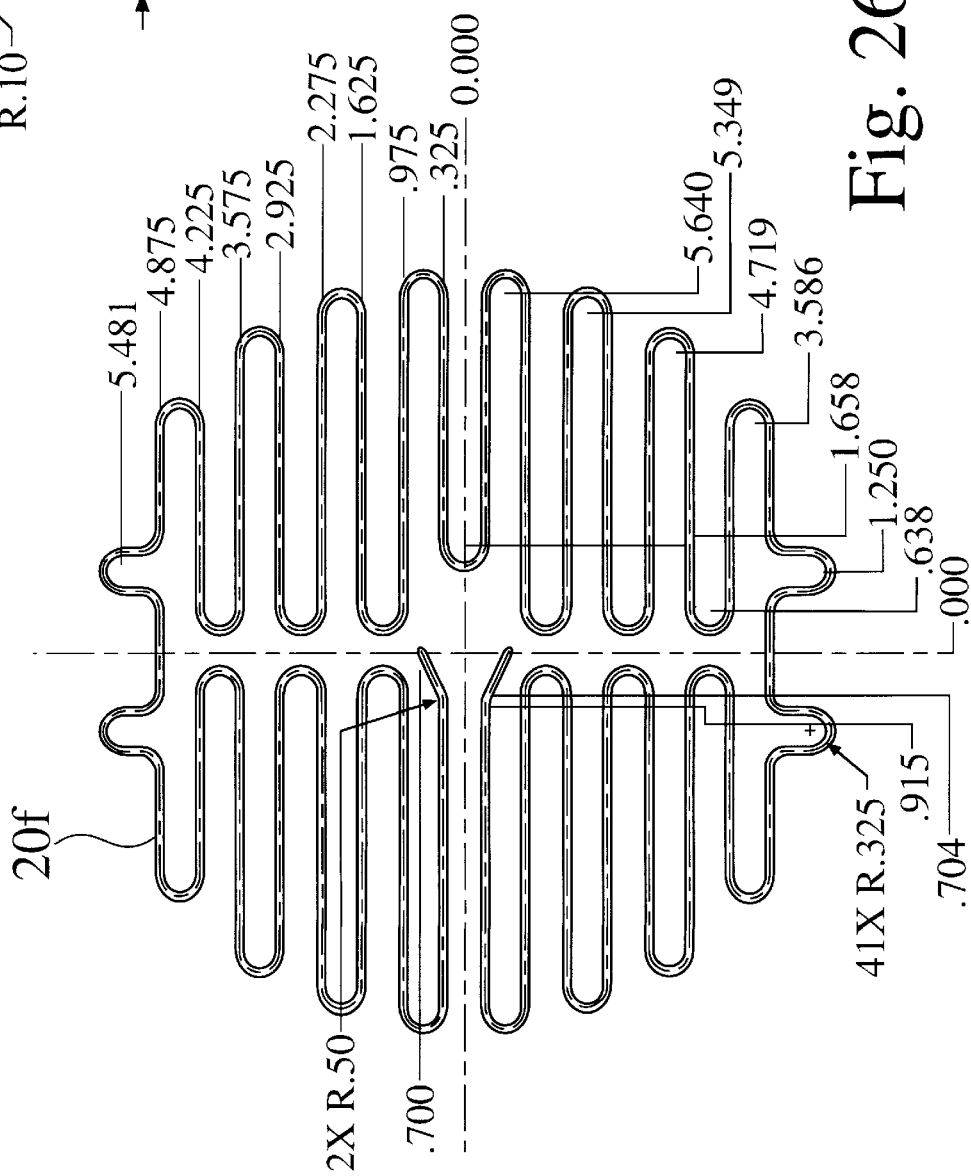
Fig. 27
Fig. 26

| RADIUS | R1 | R2 | R3 | R4 | R5 | R6 | R7 |
|---|---|---|---|---|---|---|---|
| CENTER, ORDINATE X | 3.473 | 1.959 | 1.918 | 1.722 | 1.467 | .130 | 1.479 |
| CENTER, ORDINATE Y | 3.221 | 3.244 | 2.320 | 1.075 | .500 | .733 | 5.370 |
| LENGTH | 2.38 | 1.20 | 1.20 | 1.00 | .50 | .50 | .40 |

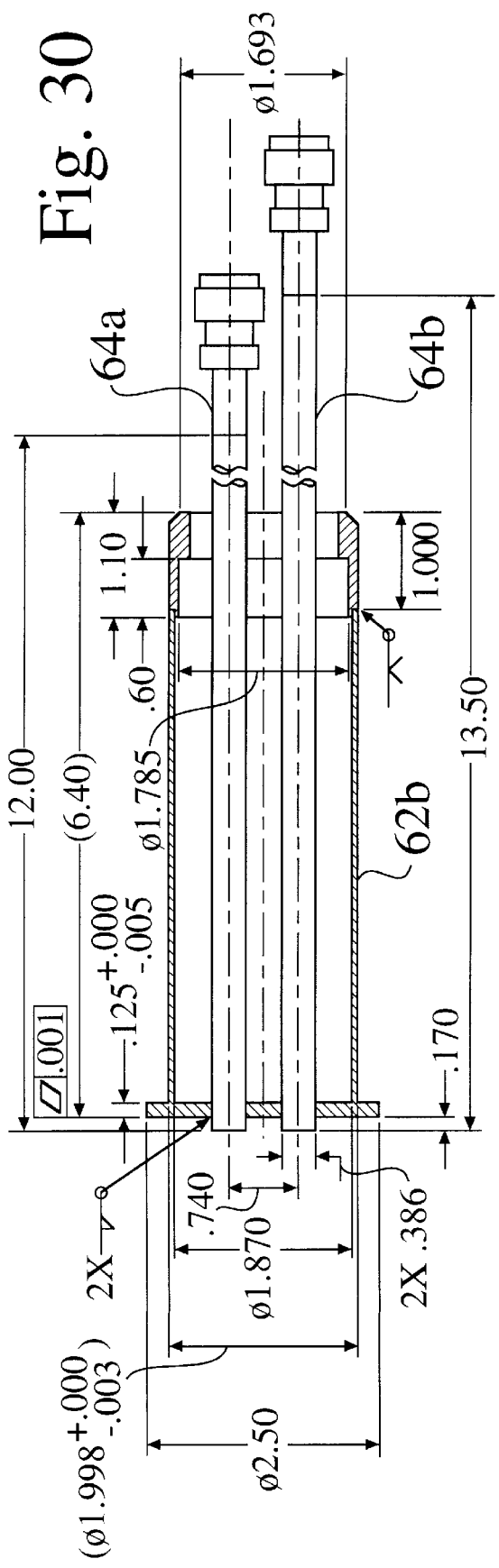
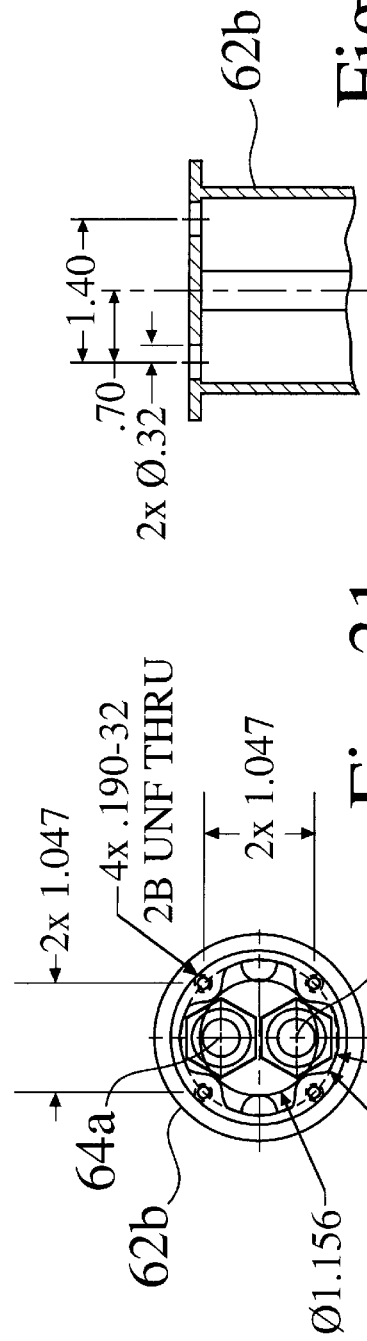

LAMINATED PADDLE HEATER AND BRAZING PROCESS

CROSS-REFERENCE TO RELATED APPLICATIONS

This is a divisional of U.S. application Ser. No. 09/107,950, filed Jun. 30, 1998.

FIELD OF THE INVENTION

The invention relates to the field of heat exchange devices. More particularly, the invention relates to improved construction techniques for laminated heater assemblies.

BACKGROUND OF THE INVENTION

Heater assemblies are used to create a generally flat temperature zones on substrates, onto which semiconductors are formed by metal organic vapor deposition methods.

Current prior art heaters used for heating substrates feature porous cast heater bodies having heater coils that are swaged into grooves. In some prior art heaters, heater cable is suspended in a pattern while a plate is cast, resulting in an embedded heater element that can have an uneven profile. The use of porous cast heater components can result in outgassing when subjected to typical vacuum semiconductor processing environments. Furthermore, the swaged construction commonly results in the distortion or warping of heater assemblies as they are operated at process temperatures.

S. Boldish and S. Ciofalo, Epitaxial Heater Apparatus and Process, U.S. Pat. No. 4,777,022 Oct. 11, 1988) disclose a chemical vapor deposition apparatus having a quartz envelope supporting a resistance heater. A core supports resistance heater windings. An alternative horizontal configuration includes a laminar flow head disposed at an angle to the horizontal.

J. Banker, Aluminum/Steel Transition Joint, U.S. Pat. No. 5,213,904 (May 25, 1993) discloses a transition joint between aluminum and steel comprising complex interlayers of titanium and copper-nickel, formed by an explosive bonding process.

W. Blair, Method of Manufacturing Lightweight Thermobarrier Material, U.S. Pat. No. 4,703,159 (Oct. 27, 1987) discloses a method of manufacturing thermal barrier structures comprising at least three dimpled cores separated by flat plate material with the outer surface of the flat plate material joined together by diffusion bonding.

W. Blair, Bi-Metallic Thermo-barrier Material and Method of Welding, U.S. Pat. No. 4,318,965 (Mar. 9, 1982) discloses the manufacturing of multi-layer, bi-metallic thermobarrier material utilizing combined brazing and diffusion bonding methods of joining together the components of the barrier material.

The disclosed prior art systems and methodologies thus provide heaters for semiconductor processing, and disclose some methods for providing bonds between dissimilar metals, but fail to provide a strong, homogeneous heater assembly that offers exceptional heat distribution and with minimal heat variation and distortion, which can be used in a vacuum environment without outgassing. The development of such improvements to a heater system would constitute a major technological advance.

SUMMARY OF THE INVENTION

A laminated heater paddle is provided, in which a heater element having a symmetrical pattern is brazed within a heater channel defined between a first layer of aluminum and a second layer of aluminum or nickel plated stainless steel. The laminated heater paddle provides brazed junctions between dissimilar metals. The heater element, having a stainless steel (or other) outer surface, is plated with nickel, and is then squeezed between the lower and upper layers. An aluminum alloy brazing sheet is used between the first layer and the second layer, wherein the aluminum brazing sheet provides a brazing medium. The assembly is then subjected to a vacuum, before being heated near the melting point of the aluminum. A brazed transition forms between the first layer and the second layer, and between the heater element and the heater channel. Alternative heater embodiments include vent tubes or cooling tubes between two or more brazed layers. The brazing process can alteratively be used for other applications.

BRIEF DESCRIPTION OF THE DRAWINGS

FIG. 10 is a partial top cutaway view of a laminated paddle heater having an internal guide tube;

FIG. 11 is a partial front side view of a laminated paddle heater having an internal guide tube;

FIG. 18 is a side view of an alternative cooled heater susceptor laminated paddle assembly embodiment;

FIG. 19 is a bottom view of the alternative cooled heater susceptor laminated paddle assembly shown in FIG. 18;

FIG. 20 is a partial side cross section of the alternative cooled heater susceptor laminated paddle assembly;

FIG. 23 is a bottom view of the central layer and heater groove for the alternative cooled heater susceptor laminated paddle assembly;

FIG. 24 is a cross sectional view of the central layer for the alternative cooled heater susceptor laminated paddle assembly;

FIG. 25 is a partial cross sectional view of the heater groove through the central layer shown in FIG. 23;

FIG. 26 is a bottom view of the heater element for the alternative cooled heater susceptor laminated paddle assembly;

FIG. 27 is a side view of the heater element for the alternative cooled heater susceptor laminated paddle assembly;

FIG. 30 is a cross sectional view of the lead transition chamber and cooling tubing leads for the alternative cooled heater susceptor laminated paddle assembly;

FIG. 31 is a bottom view of the lead transition chamber and cooling tubing leads for the alternative cooled heater susceptor laminated paddle assembly; and FIG. 32 is a partial cross sectional view of the lead transition chamber shown in FIG. 30.

DETAILED DESCRIPTION OF PREFERRED EMBODIMENTS

Figure 1:
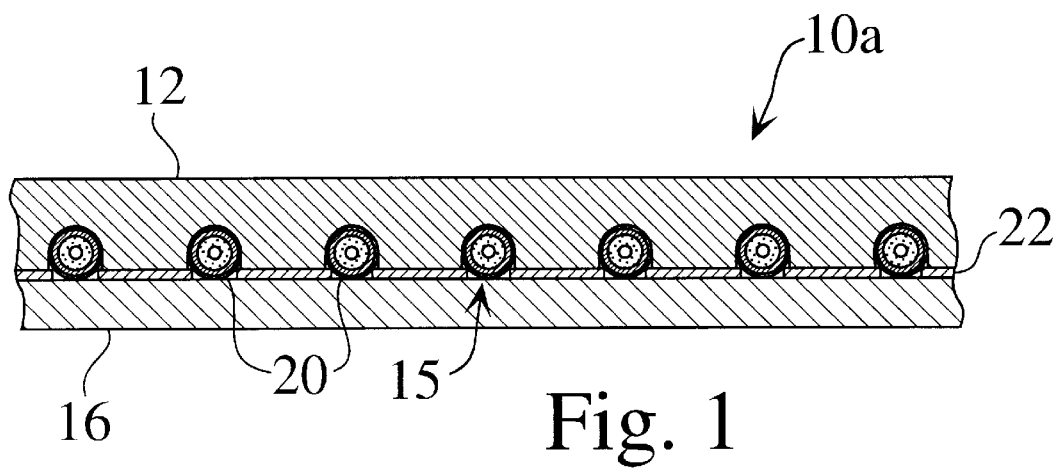
FIG. 1 is a partial cross sectional view of a laminated paddle heater.
Figure 2:
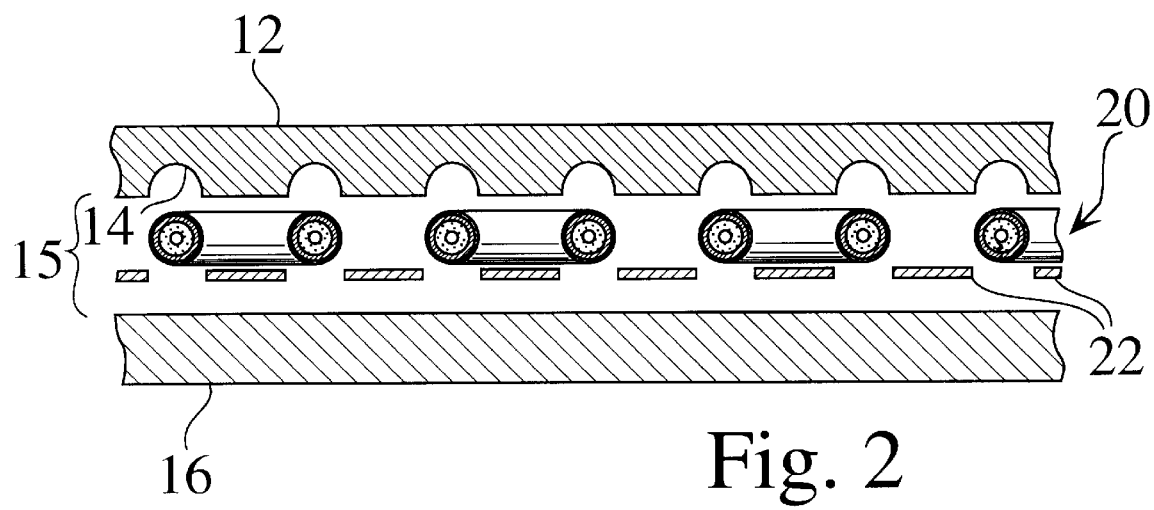
FIG. 2 is an exploded partial cross sectional view of a laminated paddle heater.

FIG. 1 is a partial cross sectional view of a laminated paddle heater 10a. FIG. 2 is an exploded partial cross sectional view of the laminated paddle heater 10a. An upper layer 12 has a heater groove 14 which has a depth that is approximately equal to the diameter of the heater cable. A lower layer 16 mates to the heater groove 14 to define a heater channel 15. The groove may be formed as a radiused milled groove. A heater element 20 is located within the heater channel 15. Brazing shims 22 are located between the lower layer 16 and the upper layer 12, and are separated by the heater channels 15 and by the periphery of the lower layer 16 and the upper layer 12. The brazing shims 22 form a brazed homogeneous bond between the lower layer 16 and the upper layer 12, after the assembly is brazed, as discussed below. In alternative embodiments of the invention, each layer of the assembly may be grooved to define the heater channel.

Figure 3:
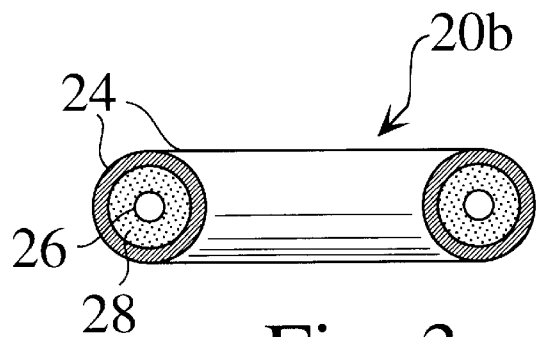
FIG. 3 is a partial cross sectional view of a heater element having a stainless steel outer sheath.
Figure 4:
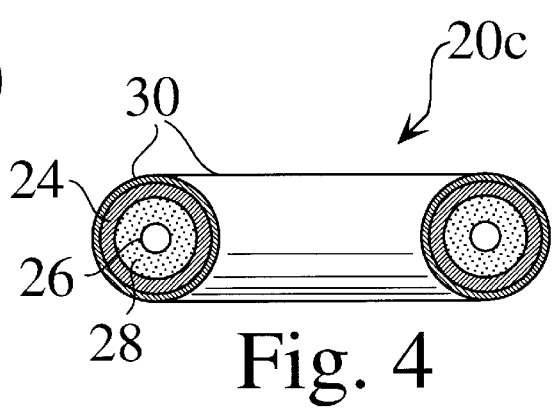
FIG. 4 is a partial cross sectional view of a heater element having a stainless steel outer sheath with a plated nickel layer.

FIG. 3 is a partial cross sectional view of a heater element 20b having a stainless steel outer sheath 24, surrounding resistance heater wire encased within a conductive ceramic layer 28. FIG. 4 is a partial cross sectional view of a heater element 20c having a stainless steel outer sheath 24 with a plated nickel layer 30. As will be discussed below, the plated nickel layer 30 is used to allow a brazed bond between the heater 20 and the surfaces of upper 12 and lower layers 16.

The heater element 20 forms a symmetric pattern within the heater channel 15, which allows the heater 20 to provide accurate and even heat transfer to a substrate workpiece. The symmetric heater element pattern also avoids thermal stress across the heater assembly 10 by promoting even thermal expansion and contraction.

The homogenous brazed construction between the lower layer 16 and the upper layer 12, and between the heater 20 and the heater groove 14 allows the laminated heater paddle 10 to function without thermal distortion. Because the laminated heater paddle 10 has brazed construction, it is inherently fully annealed, and operates without thermal stress.

Laminate Brazing Process. As discussed above, a unique brazing process 40 is used to achieve intimate physical attachment and thermal contact between components in the laminated paddle heater assembly 10. The brazing process 40 can also be used, more broadly, to join dissimilar metals for many other applications.

Figure 5:
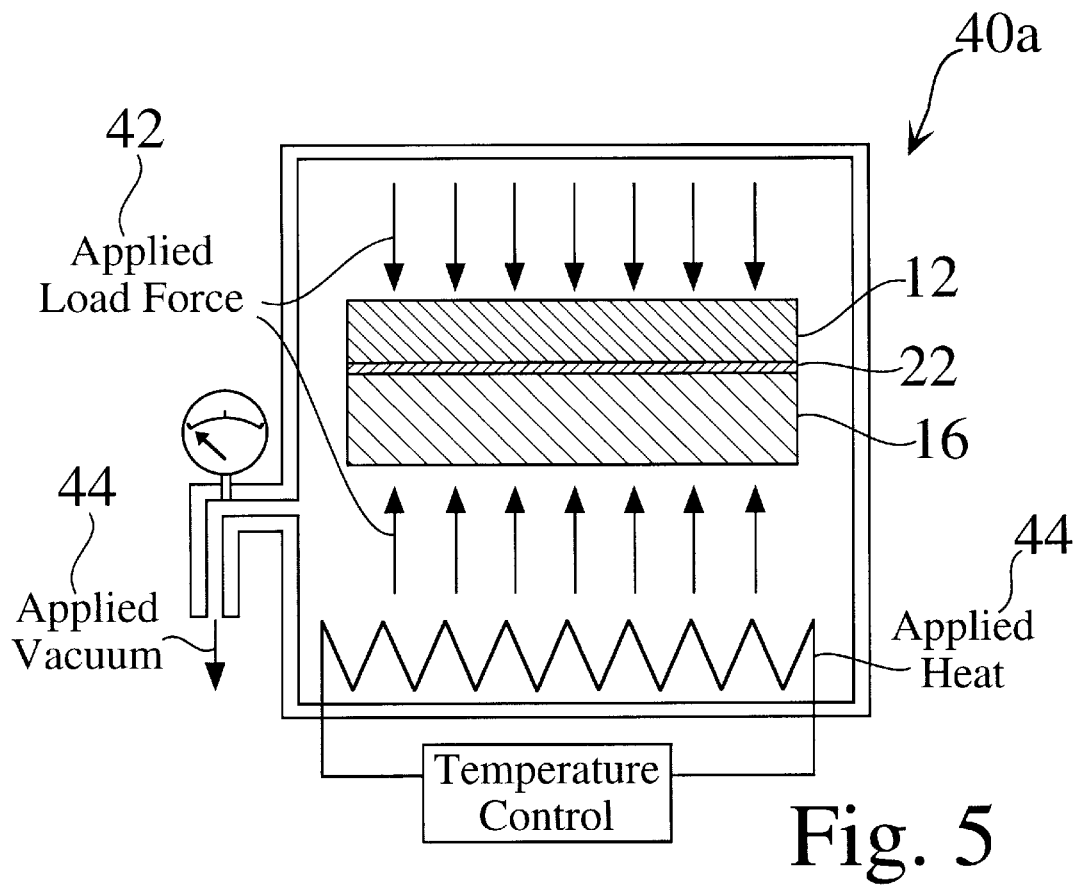
FIG. 5 is a schematic view of the basic brazing process used to form a bond between dissimilar metals according to the present invention.
Figure 6:
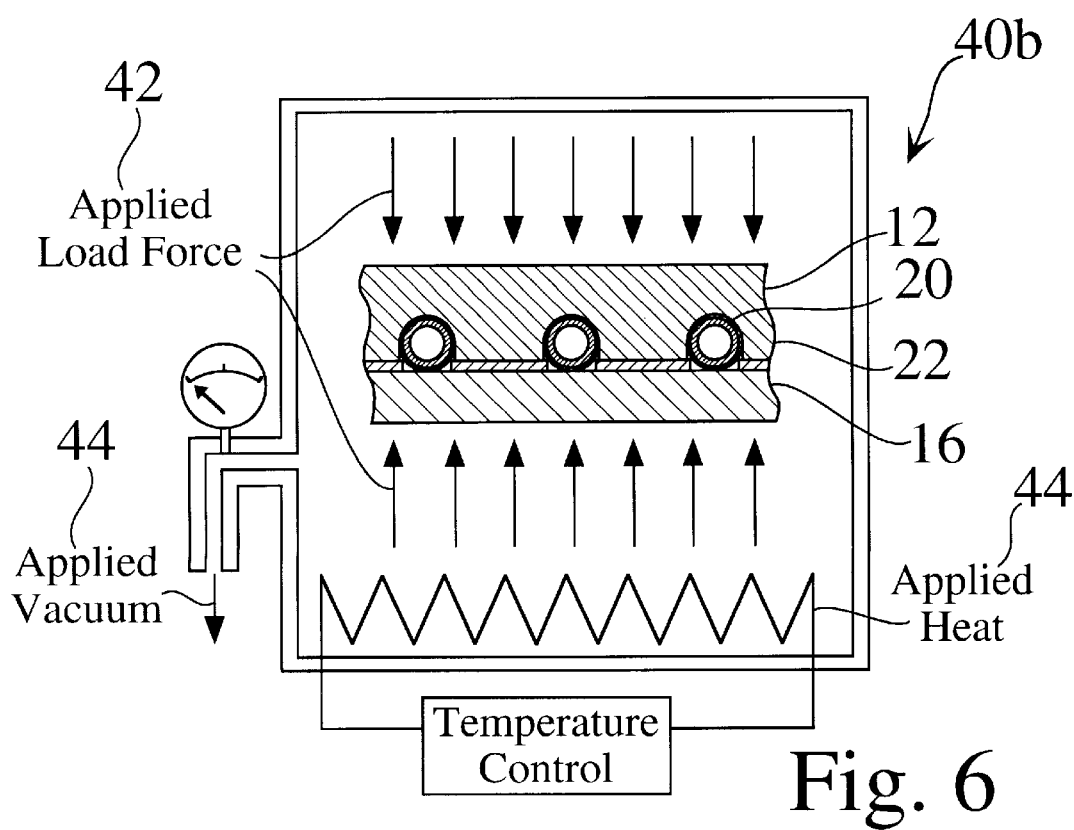
FIG. 6 is a schematic view of the brazing process used to form a laminated paddle heater.

FIG. 5 is a schematic view of the basic brazing process 40a used to form a bond between and upper layer 12 and a lower layer 16, in which the layers 12 and 16 are constructed of dissimilar metals. Similarly, FIG. 6 is a schematic view of the brazing process 40b used to form a laminated paddle heater 10.

The brazing process produces a joint between dissimilar metals that can be applied to vacuum systems. The upper layer 12 and the bottom layer 16 of the laminated paddle heater 10 are typically constructed of aluminum or aluminum alloys. Alternatively, each of the layers 12 or 16 can be constructed from nickel stainless steel. The heater 20 is typically manufactured with a stainless steel sheath or housing 24. Aluminum and stainless steel are incompatible for traditional metallurgical bonding processes (i.e. they cannot be joined via welding or soldering).

The brazing process used to join the aluminum and stainless steel components comprises the following steps:
i) Plating the stainless steel components with electrolysis nickel plating 30;
ii) Placing the aluminum and stainless steel components together, to create a sandwich between them, using thin aluminum shim stock 22 (which acts as the brazing medium);
ii) Load forcing 42 (squeezing) the components together;
iv) Placing the constrained components in a vacuum environment (e.g. at 28–29" mercury); and
v) Heating 45 the components near the melting point of aluminum.

The softer aluminum shim stock 22 melts and braises together the nickel plated stainless steel 20 and aluminum portions 12 and 16 of the assembly. In one embodiment of the brazing process, the aluminum shim stock 22 is 1100 gauge aluminum. The resulting brazed seal between the aluminum and stainless steel parts is strong enough to withstand a vacuum.

The plating step usually does not include baking the plated nickel 30 onto the surface of the stainless steel 24, since baking 45 can oxidize the surface of the nickel plate 30, and can adversely effect the quality of the braised joint.

System Advantages. The brazed construction of the laminated paddle heater 10 provides many advantages over heater assemblies that use cast heater components. The design and manufacture of cast components is complicated, and results in porous assemblies, which can outgas in vacuum environments used for semiconductor processing. Additionally, actual element location is unknown in such assemblies.

The ability to braze aluminum and stainless steel together provides potential weight savings for many assemblies because all or some assemblies using stainless steel components can be reduced and replaced with aluminum components. Assemblies can be designed to take advantage of the material properties of stainless steel, such as strength and resistance to corrosion, and the material properties of aluminum, such as thermal conduction, density, and cost.

The laminated, symmetrical construction produces a strong, homogeneous assembly that offers exceptional heat distribution, with minimal heat variation and distortion. The brazed, annealed assembly has minimal metallurgical stress, which provides more stable operation at process temperatures.

The brazed construction provided by the laminated heater paddle can be used for a number of alternative applications, including heaters, medical instrumentation and equipment, cookware, and automobile components. The brazing system allows non-porous aluminum components to replace or reduce the use of cast or stainless steel components for many applications, which can potentially reduce the weight or cost of the products.

Figure 7:
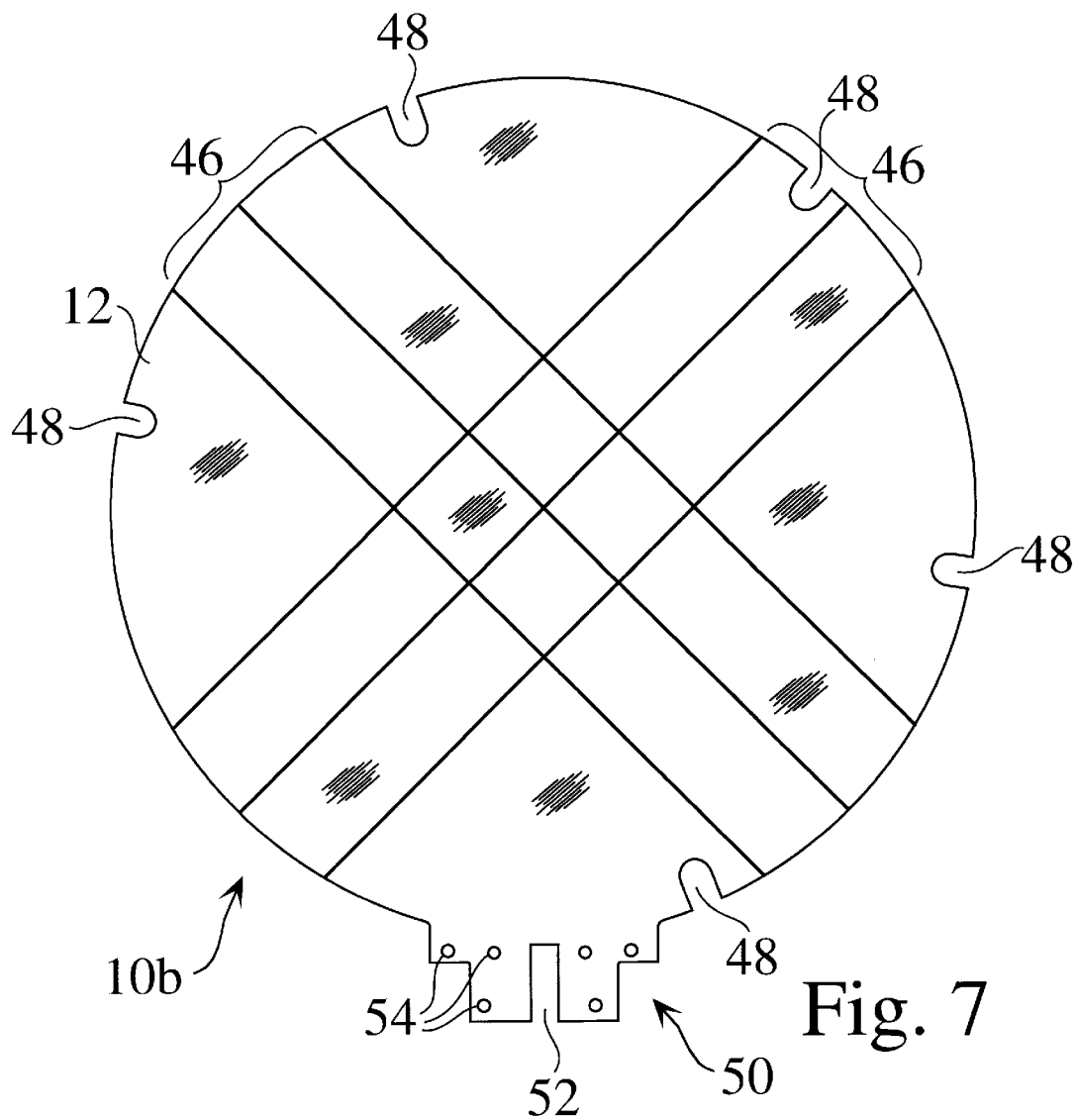
FIG. 7 is a top view of a laminated paddle heater having an internal guide tube.
Figure 8:
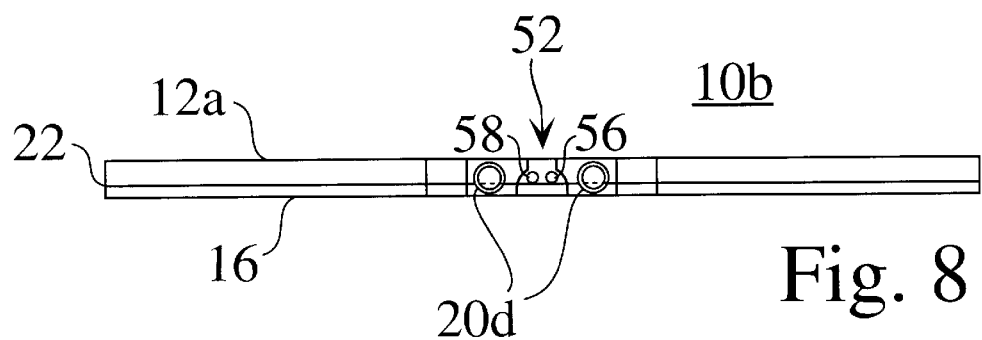
FIG. 8 is a front side view of a laminated paddle heater having an internal guide tube.
Figure 9:
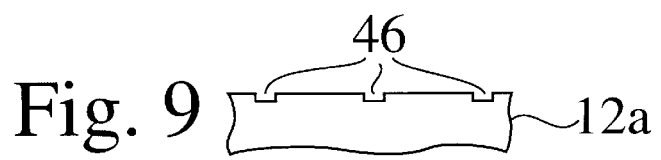
FIG. 9 shows outer groove details on the outer surface layer of the laminated paddle heater shown in FIG. 7 and FIG. 8.

Laminated Paddle Heater with Internal Vents. FIG. 7 is a top view of a preferred embodiment of a laminated paddle heater 10b having internal vent tubing 56 and 58. FIG. 8 is a front side view of the laminated paddle heater 10b shown in FIG. 7. FIG. 9 shows outer groove details 46 on the outer surface layer 12a of the laminated paddle heater 10b. The grooves are provided to break wafer adhesion to the heater that would otherwise result. FIGS. 10 and 11 show partial top cutaway and front side views of the laminated paddle heater 10b. An upper layer 12a, having heater grooves 14 and vent grooves 51a and 51b, is brazed to a lower layer 16a.

A symmetric heater element 20d is brazed within a heater channel 15b between the lower layer 16a and the upper layer 12a. The heater channel 15 is formed by the heater groove 14a located on the upper layer 12a, and the lower layer 16a. The heater element 20d forms a symmetrical pattern to create a generally flat temperature zone across a substrate workpiece.

The leads of the heater 20d extend from the side of the assembly 10c, within a lead transition area 50. The guide tubes 56 and 58 also extend from the lead transition area 50. The lead transition area 50 has connection holes 54 to attach the laminated paddle heater 10b, the heater 20d, and the guide tubes 56 and 58 to external assemblies. Slots 48 are located about the periphery of the laminated paddle assembly 10b to provide for lift pins. In one preferred embodiment of the laminated paddle heater 10b, the brazed assembly is clear anodized to protect the outer surfaces.

Figure 12:
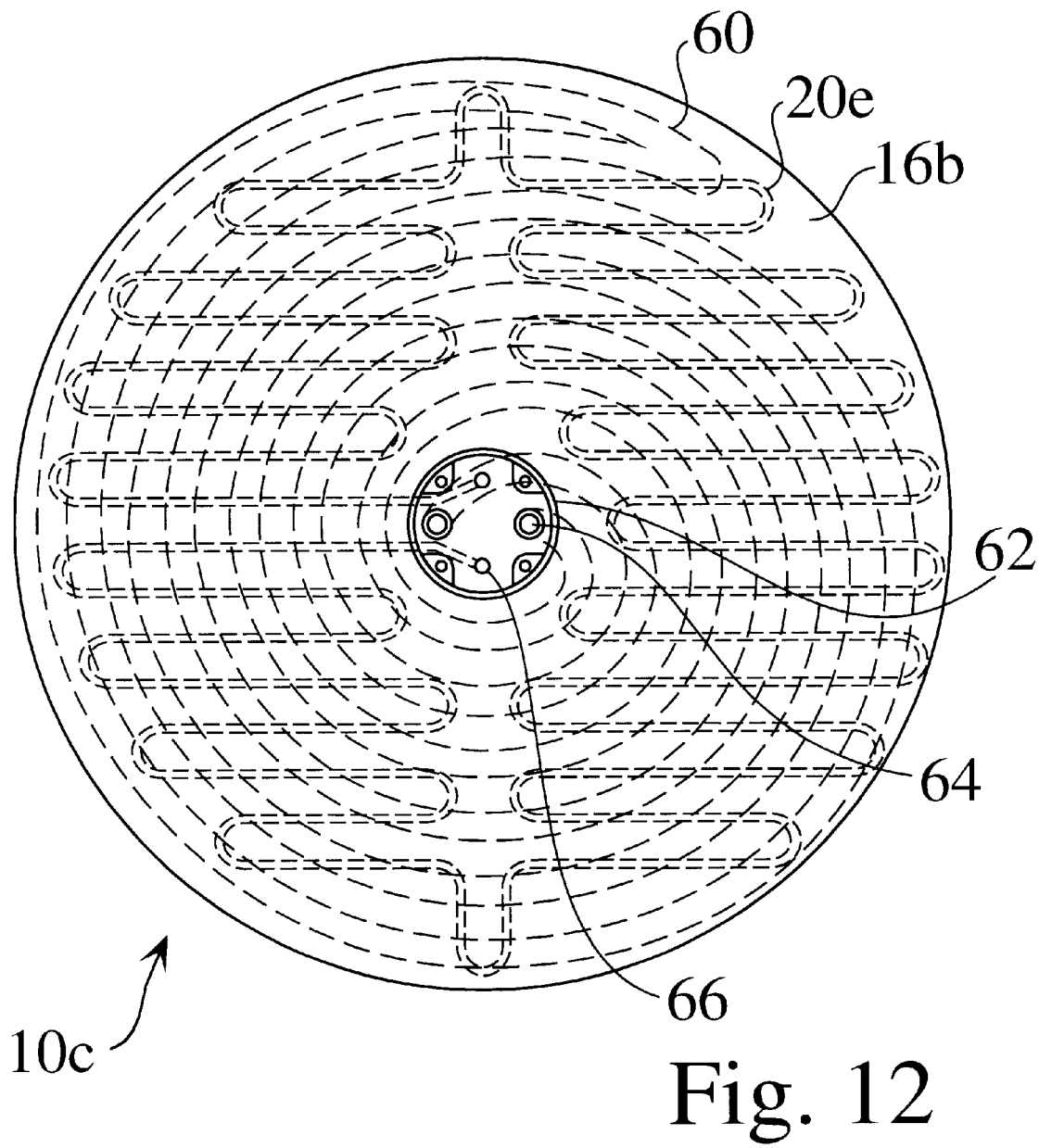
FIG. 12 is a bottom view of a cooled heater susceptor laminated paddle assembly.
Figure 13:
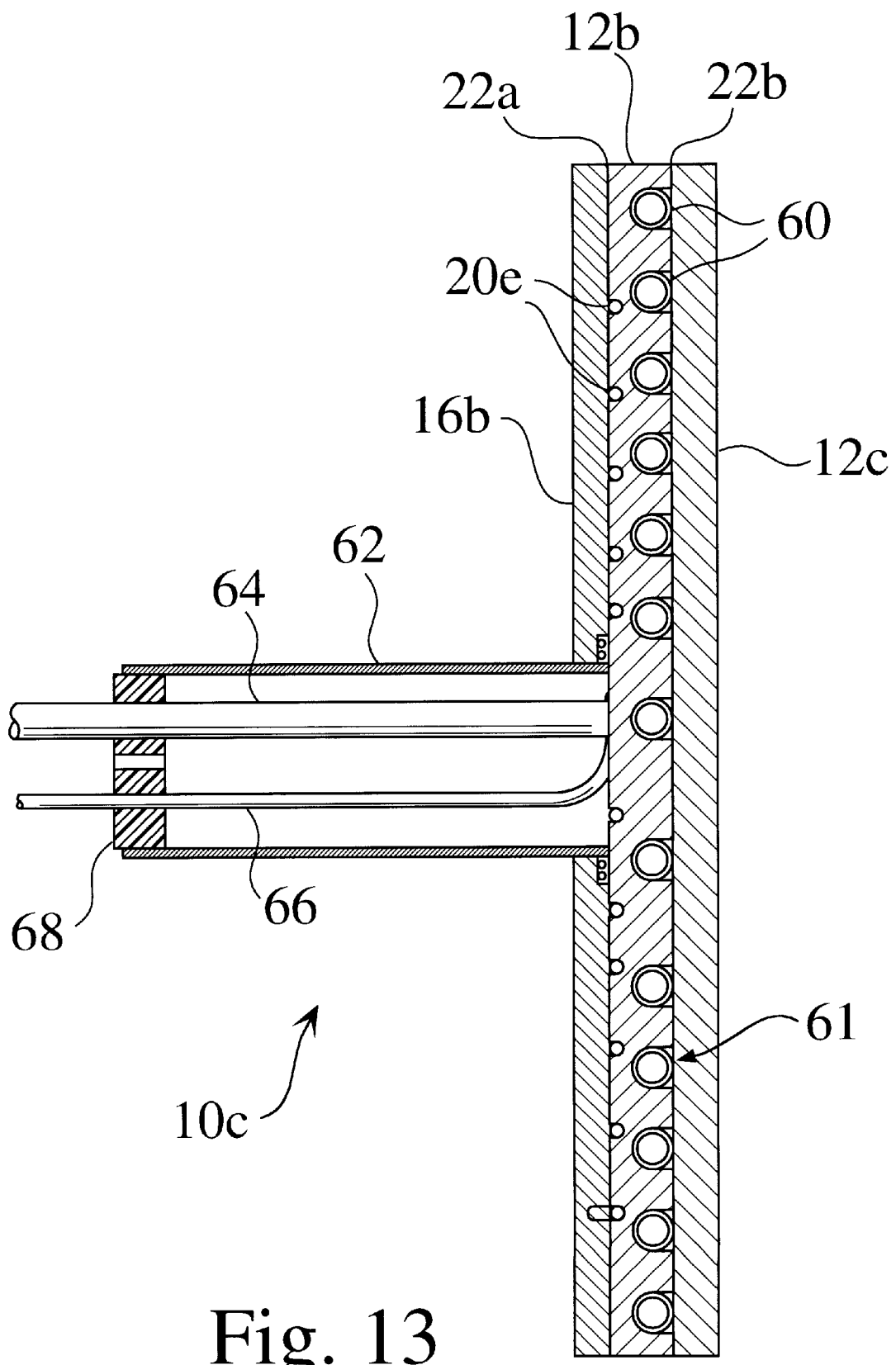
FIG. 13 is a cross sectional view of a cooled heater susceptor laminated paddle assembly.

Cooled Heater Susceptor Laminated Paddle Assembly. FIG. 12 is a bottom view of a preferred cooled heater susceptor laminated paddle assembly 10c. FIG. 13 is a cross sectional view of the cooled heater susceptor laminated paddle assembly 10c shown in FIG. 12. A combination of a symmetric heater 20e and a symmetric cooler 60 is used to provide precise thermal control across a substrate workpiece.

The symmetric heater element 20e is brazed within a heater channel 15 between a lower paddle layer 16b and a center paddle layer 12b. The heater channel 15 is formed by a heater groove 14 located on the center paddle layer 12b. The heater element 20e forms a generally symmetrical pattern to create a generally flat temperature zone across a workpiece substrate. Heater outer leads 66 extend from the back laminated surface of the assembly 10c, within a lead transition chamber 62 and through a chamber bulkhead 68.

A symmetric cooling element 60 is brazed within a cooling channel 61 between the center paddle layer 12b and an outer paddle layer 12c. The cooling channel 61 is formed by a cooling groove 70a located on the center paddle layer 12b. The cooling element 60 is used to lower the temperature of the heater assembly 10c, and forms a symmetrical pattern to create a generally flat temperature zone across the laminated paddle assembly 10c. Cooling tubing leads 66 extend from the back laminated surface of the assembly 10c, within the lead transition chamber 62 and through the chamber bulkhead 68. The cooling passage is used to channel process gas, compressed air, or refrigerant to the paddle.

Figure 14:
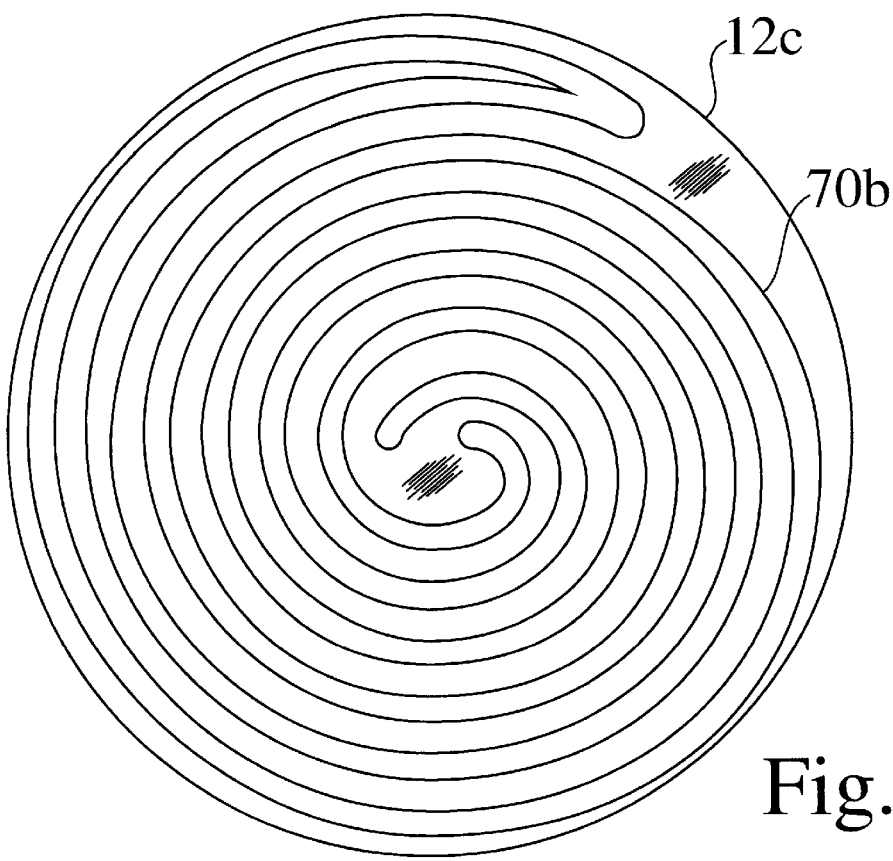
FIG. 14 shows the inner surface of the top surface layer of a cooled heater susceptor having a helical cooling channel groove.
Figure 16:
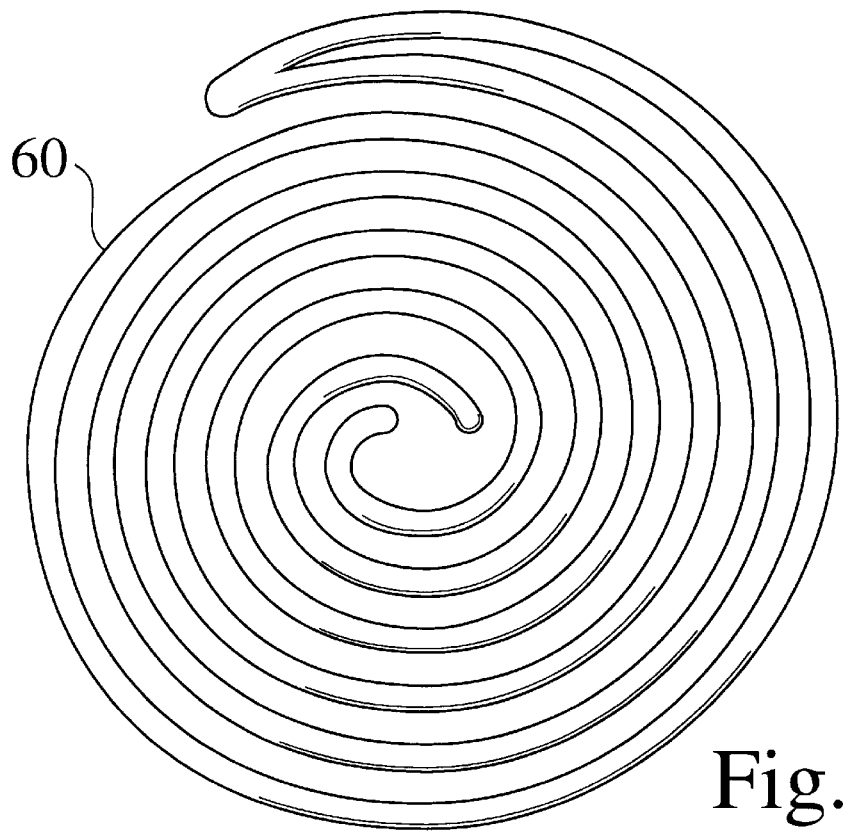
FIG. 16 is a top view of the symmetrical cooling tubing of the cooled heater susceptor laminated paddle assembly.

FIG. 14 shows the inner surface of the center surface layer 12b of the cooled heater susceptor 10c having a helical cooling channel groove 70b. The top surface layer 12c mates with the center layer 12b and the two layers thus channel the cooling tubing leads 64 from the back laminated surface of the cooled heater susceptor assembly 10c into the lead transition chamber 62. FIG. 16 is a top view of the helical cooling tubing 60 of the cooled heater susceptor laminated paddle assembly 10c.

Figure 15:
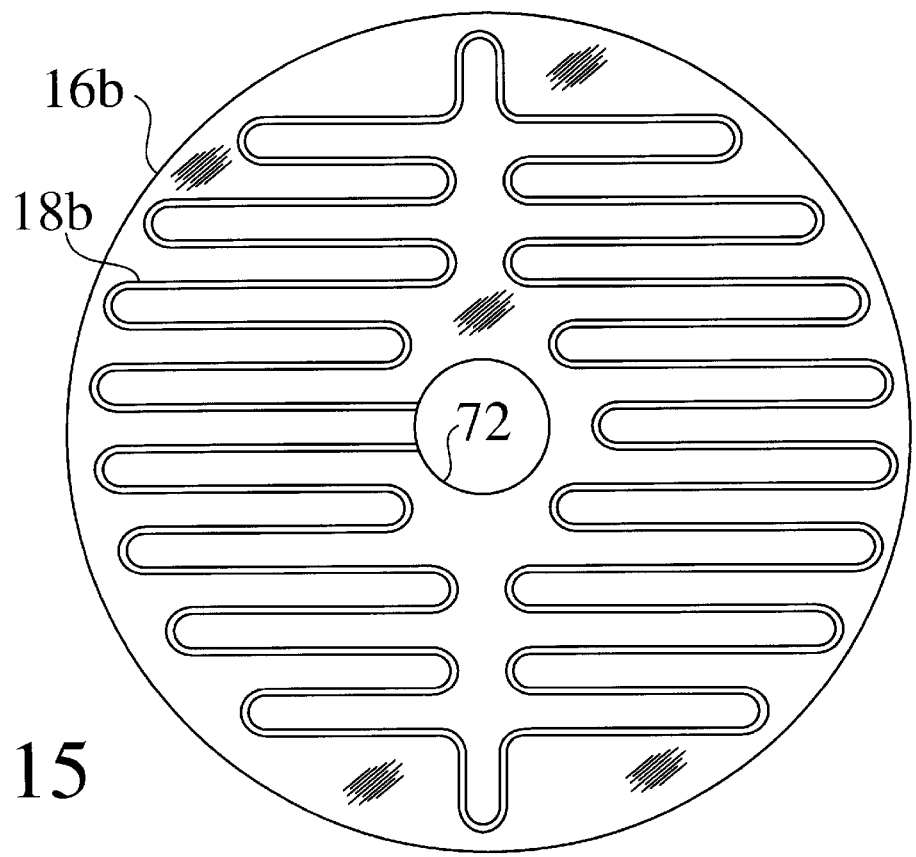
FIG. 15 shows the inner surface of the bottom surface layer of a cooled heater susceptor having a symmetrical heater channel groove.
Figure 17:
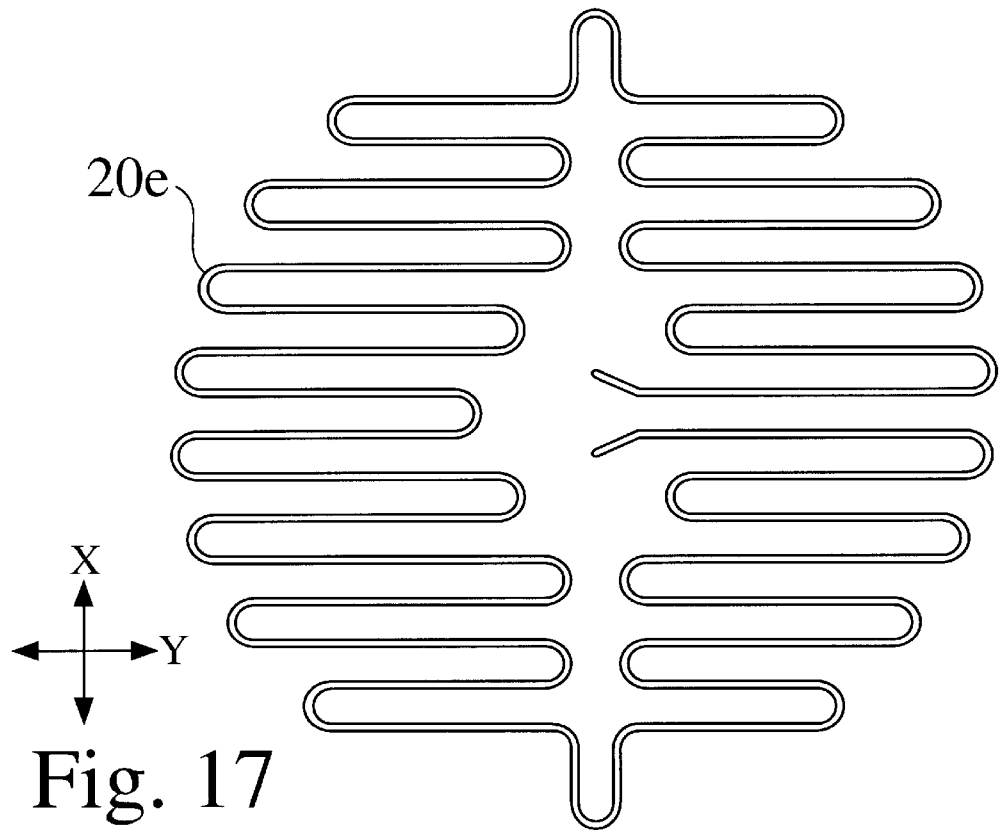
FIG. 17 is a top view of the symmetrical heater of the cooled heater susceptor laminated paddle assembly.

FIG. 15 shows the other outer surface of the center surface layer 12b of a cooled heater susceptor 10c, having a symmetrical heater channel groove 18b. The bottom surface layer 16b has a chamber access hole 72, through which the heater outer leads 66 and cooling tubing leads 64 are routed into the lead transition chamber 62. This transition is brazed in accordance with the high pressure technique discussed above. FIG. 17 is a top view of the symmetrical heater 20e of the cooled heater susceptor laminated paddle assembly 10c.

Alternative Cooled Heater Susceptor Laminated Paddle Assembly. FIG. 18 is a side view of an alternative cooled heater susceptor laminated paddle assembly 10d. FIG. 19 is a bottom view of the alternative cooled heater susceptor laminated paddle assembly 10d shown in FIG. 18. FIG. 20 is a partial side cross section of the alternative cooled heater susceptor laminated paddle assembly 10d, showing connection details between a lower layer 16c, a center layer 12d, and a top layer 12e.

Figure 22:
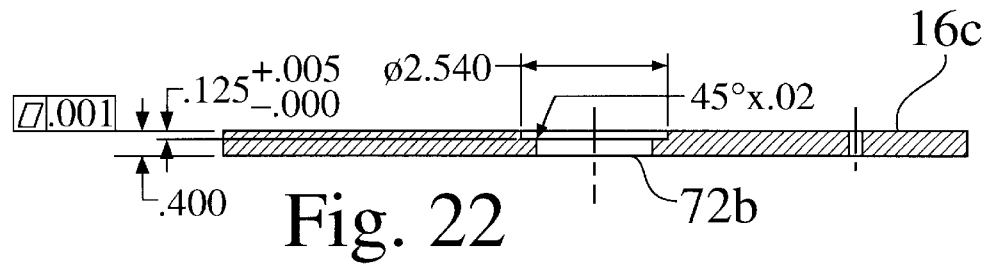
FIG. 22 is a cross sectional view of the lower layer for the alternative cooled heater susceptor laminated paddle assembly.
Figure 21:
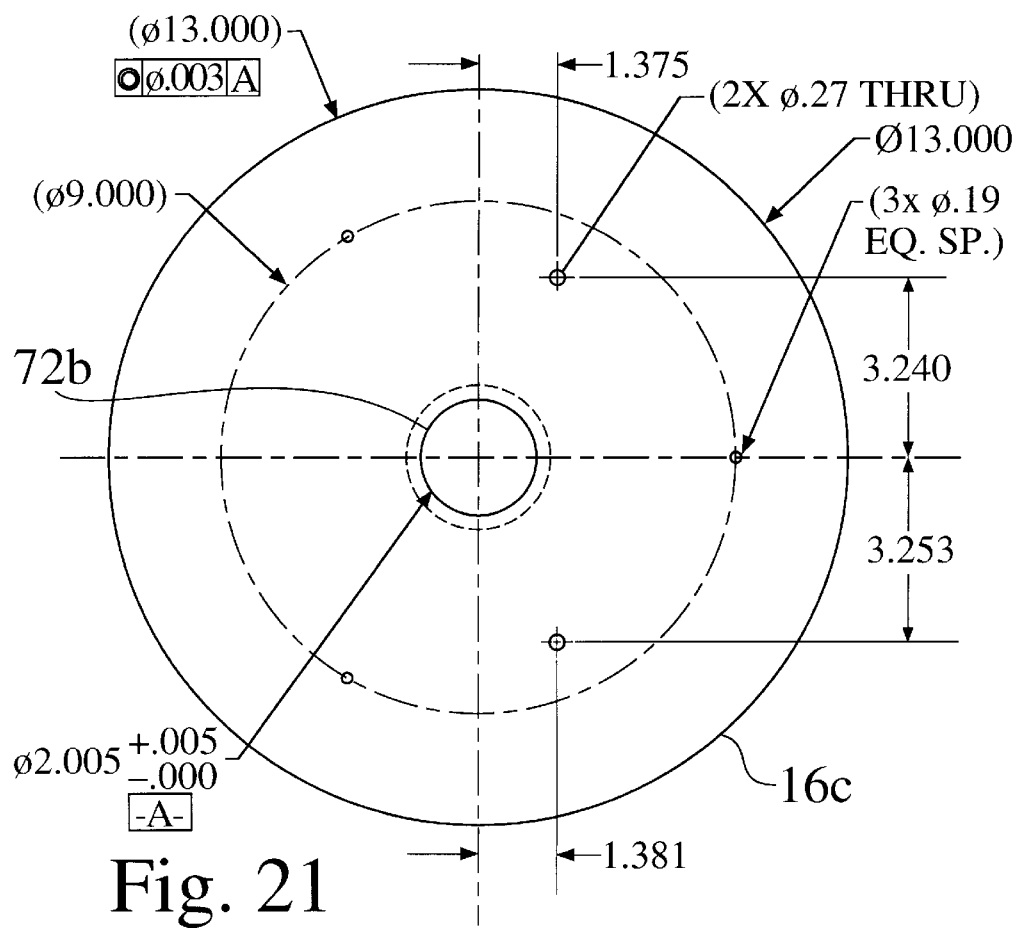
FIG. 21 is a top view of the lower layer for the alternative cooled heater susceptor laminated paddle assembly.

FIG. 21 is a top view of the lower layer 16c for the alternative cooled heater susceptor laminated paddle assembly 10d. FIG. 22 is a cross sectional view of the lower layer 16d for the alternative cooled heater susceptor laminated paddle assembly, having a chamber access hole 72b.

FIG. 23 is a bottom view of the central layer 12d and heater groove 18c for the alternative cooled heater susceptor laminated paddle assembly 10d. FIG. 24 is a cross sectional view of the central layer 12d for the alternative cooled heater susceptor laminated paddle assembly 10d. FIG. 25 is a partial cross sectional view of the heater groove 18c through the central layer 12d shown in FIG. 23.

FIG. 26 is a bottom view of the heater element 20f for the alternative cooled heater susceptor laminated paddle assembly 10d. FIG. 27 is a side view of the heater element 20f and heater element leads 66 for the alternative cooled heater susceptor laminated paddle assembly 10d. The large number of symmetric fingers included in the heater pattern provide extremely even heat transfer across the surface of the heater assembly 10d, and the long length of the heater element provides exceptional current carrying capacity. The long length has a higher resistance, such that it does not burn out quickly. A preferred embodiment of the heater element 20f, having an outer diameter of 0.062 inches, and rated at 2000 watts at an operating voltage of 208 volts, specified to operate between 650–700 degrees Centigrade can operate at 600 degrees for an extended period of time.

Figure 29:
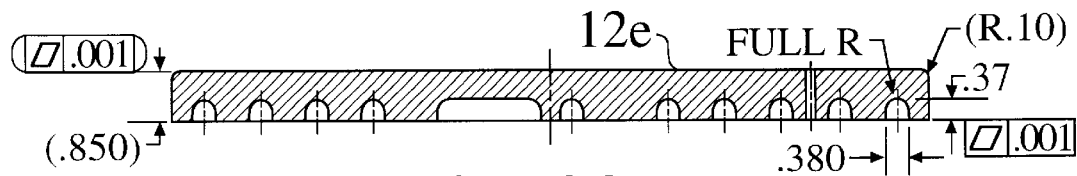
FIG. 29 is a cross sectional view of the top layer and cooler element groove for the alternative cooled heater susceptor laminated paddle assembly.
Figure 28:
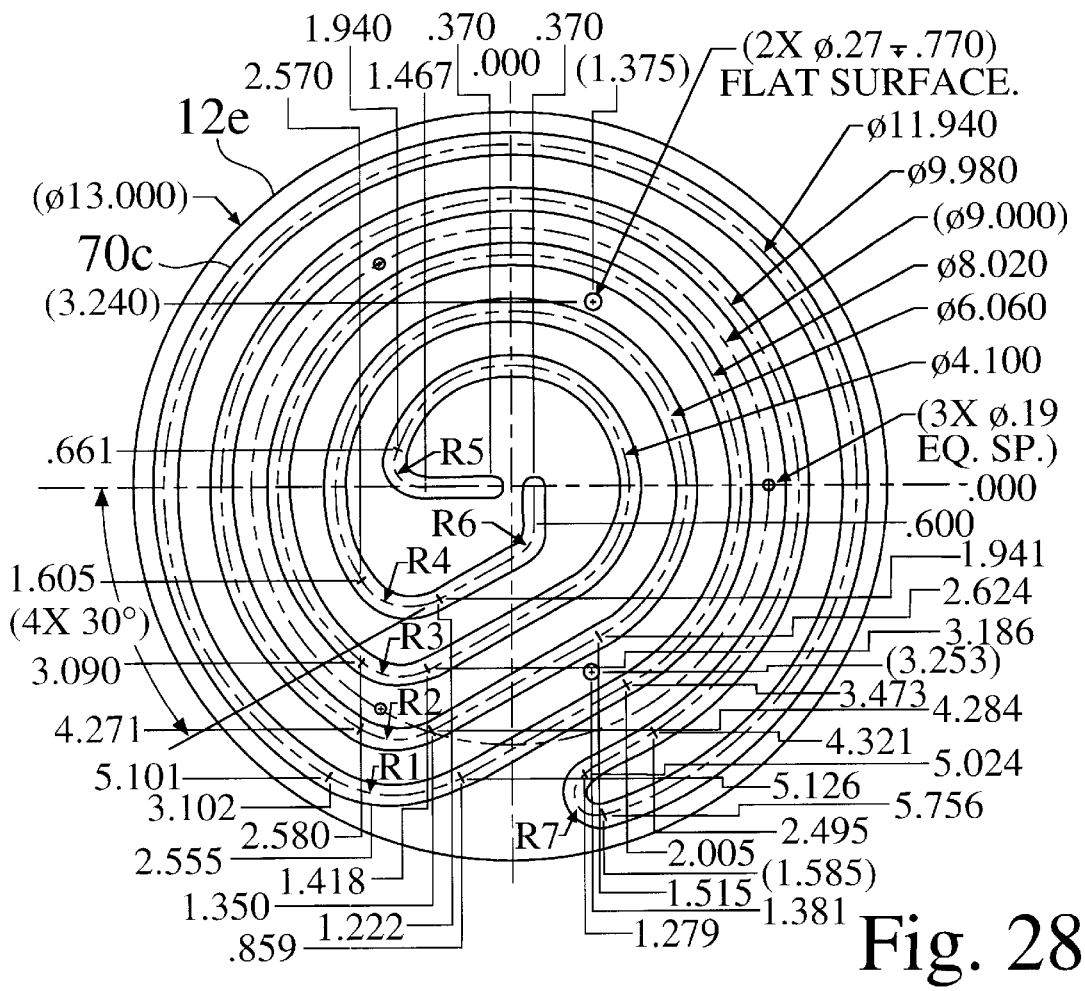
FIG. 28 is a bottom view of the top layer and cooler element groove for the alternative cooled heater susceptor laminated paddle assembly.

FIG. 28 is a bottom view of the top layer 12e and cooler element groove 70c for the alternative cooled heater susceptor laminated paddle assembly 10d. FIG. 29 is a cross sectional view of the top layer 12e and cooler element groove 70c for the alternative cooled heater susceptor laminated paddle assembly 10d.

FIG. 30 is a cross sectional view of the lead transition chamber 62b and cooling tubing leads 64a and 64b for the alternative cooled heater susceptor laminated paddle assembly 10d. FIG. 31 is a bottom view of the lead transition chamber 62b and cooling tubing leads 64a and 64b for the alternative cooled heater susceptor laminated paddle assembly. FIG. 32 is a partial cross sectional view of the lead transition chamber 62b shown in FIG. 30.

Although the laminated paddle heater 10 and its methods of use and production are described herein in connection with heaters, the techniques can be implemented for other heat exchange or process devices, or any combination thereof, as desired.

Furthermore, while the laminated paddle heater and its methods of use and production are described herein for the production of semiconductor wafers, the techniques can be implemented for heat exchange processes to any of a wide variety of workpieces, as desired.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. A laminated heater, comprising:
   a heater element having a defined thickness;
   a first metallic layer having a periphery, an outer surface and an inner surface, said inner surface of said first layer having a first heater groove, said first heater groove having a depth approximately equal to said defined thickness of said heater element;
   a second metallic layer having a periphery, an outer surface and an inner surface; and
   a brazed homogeneous aluminum bond between said inner surface of said first metallic layer and said inner surface of said second metallic layer, such that said first heater groove defines a heater channel, wherein said brazed homogeneous aluminum bond is located between said heater channel and said periphery of said first metallic layer and said periphery of said second metallic layer; and wherein
   said heater element is located within said heater channel and brazedly attached to said first heater groove the first and second metallic layers are made from aluminum.

2. The laminated heater of claim 1, wherein said first metallic layer is made from aluminum.

3. The laminated heater of claim 1, wherein said second metallic layer is made from aluminum.

4. The laminated heater of claim 1, wherein said second metallic layer is made from aluminum.

5. The laminated heater of claim 1, wherein said heater element has an outer nickel plated stainless steel sheath.

6. The laminated heater of claim 1, wherein said heater has an outer nickel plated nickel chromium alloy sheath.

7. A laminated heater, comprising:
   a first metallic layer having an outer surface and an inner surface, said inner surface of said first metallic layer having a first heater groove;
   a second metallic layer having an outer surface and an inner surface, said outer surface of said second metallic layer having a cooling grove;
   said inner surface of said first metallic layer attached to said inner surface of said second metallic layer, such that said first heater groove defines a heater channel;
   a heater element located within said heater channel and attached to said first heater groove;
   a third metallic layer having an inner surface and an outer surface;
   said outer surface of said second metallic layer attached to said inner surface of said third metallic layer, such that said cooling groove defines a cooling channel; and
   a cooling element located within said cooling channel and attached to said cooling groove.

8. The laminated heater of claim 7, wherein said cooling element has an outer nickel plated stainless steel sheath.

9. The laminated heater of claim 7, wherein said cooling element has an outer nickel plated nickel chromium alloy sheath.

10. A laminated heater, comprising:
    a first aluminum layer having an outer surface and an inner surface, said inner surface of said first aluminum layer having a first groove;
    a second aluminum layer having an outer surface and an inner surface, said inner surface of said second aluminum layer having a cooling groove;
    said inner surface of said first aluminum layer brazedly attached to said inner surface of said second aluminum layer, such that said first groove defines a first heater channel, and such that said cooling groove defines a cooling channel;
    a first heat exchange element having an outer nickel plated sheath located within said first heater channel and brazedly attached to said first groove; and
    a cooling element located within said cooling channel and brazedly attached to said cooling groove.

11. The laminated heater of claim 10, wherein said cooling element has an outer nickel plated stainless steel sheath.

12. The laminated heater of claim 10, wherein said cooling element has an outer nickel plated nickel chromium alloy sheath.

13. A laminated heater, comprising:
    a first heat exchange element having an outer nickel plated sheath, said outer nickel plated sheath having a defined thickness;
    a first aluminum layer having a periphery, an outer surface and an inner surface, said inner surface of said first layer having a first groove, said first groove having a depth approximately equal to said defined thickness of said outer nickel plated sheath of the first heat exchange element;
    a second aluminum layer having a periphery, an outer surface and an inner surface; and
    a brazed homogeneous aluminum bond between said inner surface of said first aluminum layer and said inner surface of said second aluminum layer, such that said first groove defines a first heater channel, wherein said brazed homogeneous aluminum bond is located between said first heater channel and said periphery of said first aluminum layer and said periphery of said second aluminum layer; and wherein
    said first heat exchange element is located within said first heater channel and is brazedly attached to said first groove.

14. The laminated heater of claim 13, wherein said first heat exchange element is a heater.

15. The laminated heater of claim 13, wherein said first heat exchange element is a heater.

16. The laminated heater of claim 13, wherein said first heat exchange element is a heater.

17. The laminated heater of claim 13, wherein said outer nickel plated sheath is an outer nickel plated stainless steel sheath.

18. The laminated heater of claim 13, wherein said outer nickel plated sheath is an outer nickel plated nickel chromium alloy sheath.

19. A laminated paddle heater, comprising:
 a first aluminum layer having an outer surface and an inner surface, said inner surface of said first aluminum layer having a first groove, said outer surface of said first aluminum layer having a second groove;
 a second aluminum layer having an outer surface and an inner surface;
 said inner surface of said first aluminum layer brazedly attached to said inner surface of said second aluminum layer, such that said first groove defines a first channel;
 a first heat exchange element having an outer nickel plated sheath located within said first channel and brazedly attached to said first groove;
 a third layer having an inner surface and an outer surface;
 said outer surface of said first aluminum layer brazedly attached to said inner surface of said third layer, such that said second groove defines a second channel; and
 a second heat exchange element having an outer nickel plated sheath located within said second channel and brazedly attached to said second groove.

20. The laminated paddle heater of claim 19, wherein said first heat exchange element is a heater.

21. The laminated paddle heater of claim 19, wherein said first heat exchange element is a vent tube.

22. The laminated paddle heater of claim 19, wherein said first heat exchange element is a cooling tube.

23. The laminated paddle heater of claim 19, wherein said first heat exchange element has an outer nickel plated stainless steel sheath.

24. The laminated paddle heater of claim 19, wherein the outer nickel plated sheath on said first heat exchange element is an outer nickel plated nickel chromium alloy sheath.

* * * * *